United States Patent
Fathi et al.

(10) Patent No.: US 7,901,536 B2
(45) Date of Patent: Mar. 8, 2011

(54) RESONATING CONDUCTIVE TRACES AND METHODS OF USING SAME FOR BONDING COMPONENTS

(75) Inventors: Zakaryae Fathi, Raleigh, NC (US);
Steve Greathouse, Hillsboro, OR (US);
Robert Hubbard, Mesa, AZ (US);
Iftikhar Ahmad, Raleigh, NC (US)

(73) Assignee: Lambda Technologies, Inc., Morrisville, NC (US)

( * ) Notice: Subject to any disclaimer, the term of this patent is extended or adjusted under 35 U.S.C. 154(b) by 893 days.

(21) Appl. No.: 11/807,435

(22) Filed: May 29, 2007

(65) Prior Publication Data
US 2007/0284034 A1    Dec. 13, 2007

Related U.S. Application Data

(60) Provisional application No. 60/809,435, filed on May 30, 2006.

(51) Int. Cl.
*B29C 65/48* (2006.01)
*H05B 6/64* (2006.01)
*H05K 1/00* (2006.01)

(52) U.S. Cl. ................... 156/275.1; 156/272.4

(58) Field of Classification Search ............... 156/272.2, 156/272.4, 273.9, 274.2, 275.1; 219/278
See application file for complete search history.

(56) References Cited

U.S. PATENT DOCUMENTS 6,312,548 B1 * 11/2001 Fathi et al. ................. 156/275.1

FOREIGN PATENT DOCUMENTS

| DE | 103 48 253 B3 | 2/2005 |
| EP | 1 155 798 A1 | 11/2001 |
| GB | 1037077 A | 7/1966 |

OTHER PUBLICATIONS

International Search Report and Written Opinion of International Searching Authority corresponding to PCT/US2007/012750, mailed Dec. 27, 2007.

* cited by examiner

*Primary Examiner* — Richard Crispino
*Assistant Examiner* — Daniel McNally
(74) *Attorney, Agent, or Firm* — Myers Bigel Sibley & Sajovec, P.A.

(57) ABSTRACT

Conductive traces and patterns of same are used to bond components together via electromagnetic radiation. Each conductive trace is configured to resonate and heat up when irradiated with electromagnetic radiation, such as microwave energy and/or RF energy, having a wavelength that is about 2.3 times the length of the conductive trace. The conductive traces may be arranged in a pattern to uniformly heat a target area of a substrate or other component to a selected temperature when irradiated with electromagnetic radiation.

17 Claims, 6 Drawing Sheets

RESONATING CONDUCTIVE TRACES AND METHODS OF USING SAME FOR BONDING COMPONENTS

RELATED APPLICATION

This application claims the benefit of and priority to U.S. Provisional Patent Application No. 60/809,435, filed May 30, 2006, the disclosure of which is incorporated herein by reference as if set forth in its entirety.

FIELD OF THE INVENTION

The present invention relates generally to bonding components together, and more particularly to bonding components with electromagnetic radiation.

BACKGROUND OF THE INVENTION

It may be desirable to seal microelectronic components, such as semiconductor devices and integrated circuits (ICs), attached to printed circuit boards (PCBs) and other articles. Sealing a microelectronic component attached to a PCB can be accomplished using a variety of known methods including, for example, enclosing the microelectronic component within a physical enclosure and then sealing the enclosure, or encapsulating the microelectronic component with a liquid dielectric material that is subsequently solidified.

Unfortunately, there are drawbacks associated with these conventional methods. For example, encapsulation with a liquid dielectric material typically results in excess dielectric material which must be properly disposed of. In addition, the electrical performance of microelectronic components encapsulated in dielectric material can suffer. This is because the encapsulating dielectric material that surrounds the electrical leads of a microelectronic component can induce low signal propagation speeds. In fact, the higher the dielectric constant of the dielectric material surrounding the electrical leads, the slower the propagation speed of electrical signals.

Physical structures enclosing microelectronic components can be more desirable than encapsulation via dielectric material. One reason is because air, which has a low dielectric constant, serves as an encapsulating material within an enclosure. Because of the low dielectric constant, microelectronic components typically do not suffer from slower electrical signal propagation speeds. Another reason is that the problems associated with excess encapsulating material can be avoided by using a physical structure. Another problem is that encapsulating material and electronic components encapsulated therein can have mismatched coefficients of thermal expansion, which can result in harmful stresses in some temperature environments.

A physical structure for enclosing a microelectronic component is typically attached to a PCB adhesively or via ultrasonic welding where the enclosure walls make contact with the PCB. Ultrasonic welding involves applying a cyclic mechanical force at high frequencies that enable the creation of a bond between materials at an interface without the use of adhesives. The effectiveness of ultrasonic welding is related to the elastic modulus of the materials to be joined together. Ultrasonic welding can be limited in performance when two dissimilar materials (e.g., materials having dissimilar elastic modulus or other properties) are to be joined together. In addition, it can be difficult to apply uniform cyclic mechanical forces to the structures having multiple walls and/or complex shapes as is often encountered in microelectronics packaging.

Moreover, the application of ultrasonic waves causes components to be joined to vibrate. As such, accurate alignment can be difficult to achieve. Furthermore, because microelectronic components and PCBs often have somewhat fragile internals, they can be susceptible to damage from vibrations induced by ultrasonic waves.

Adhesive resins are often used in microelectronics packaging to seal an enclosure around a microelectronic component. However, drawbacks associated with the use of adhesive resins include expenses associated with resin storage, dispensing, and, particularly, curing. Adhesive resins can be cured at room temperature with ultraviolet (UV) light. However, the adhesive resin must be directly and completely exposed to the UV light to achieve efficient curing. Unfortunately, because of the various shapes and configurations of microelectronic components, shadow problems can prevent the UV light from reaching some portions of an adhesive resin, thereby increasing the time required to cure the resin. Moreover, curing at or below room temperature can often be a long process which can decrease production throughput and can increase production costs.

Curing adhesive resins by adding heat can reduce, often dramatically, the time required to cure. Various methods of applying heat to adhesive resin to facilitate curing are known. For example, bonding techniques utilizing induction heating techniques are described in U.S. Pat. No. 3,620,875 to Guglielmo, Sr. et al. Unfortunately, curing adhesive resins via heat can have undesirable side effects. During heating, materials with different coefficients of thermal expansion (CTE) that are being bonded together can expand at different rates which may lead to damage (e.g., warpage) to one or both of the components. In addition to CTE mismatch issues, the air inside an encapsulating physical enclosure expands during the application of heat, which increases pressure inside the encapsulating physical enclosure, which can be detrimental to the microelectronic component.

Adhesive resin curing techniques utilizing microwave energy are known and are described, for example, in U.S. Pat. Nos. 5,644,837 to Fathi et al.; 5,738,915 to Fathi et al.; 5,804,801 to Lauf et al.; 5,879,756 to Fathi et al.; and 6,312,548 to Fathi et al., each of which is incorporated herein by reference in its entirety.

SUMMARY

In view of the above discussion, conductive traces and patterns of conductive traces for use in bonding components together via electromagnetic radiation are provided. Applicants have unexpectedly discovered a relationship between the length of a conductive trace, according to embodiments of the present invention, and the incident wavelength of electromagnetic radiation (e.g., microwave energy, RF energy, etc.). This relationship is represented by the following equation $RL=0.43\lambda$; wherein RL is "resonance length" of a conductive trace and "$\lambda$" is the incident wavelength of microwave energy. Stated another way, a conductive trace, according to embodiments of the present invention, will resonate and heat up when irradiated with electromagnetic radiation (e.g., microwave energy, RF energy, etc.) having a wavelength that is about 2.3 times the length of the conductive trace. As such, resonance of a conductive trace can be triggered when exposed to microwave energy based upon the length of the conductive trace.

According to embodiments of the present invention, an article of manufacture (e.g., a printed circuit board, etc.) includes a substrate having a dielectric surface and one or more electrically isolated conductive traces disposed on a target area of the substrate surface. The one or more conductive traces are configured to uniformly heat the substrate target area to a selected temperature when irradiated with electromagnetic radiation (e.g., microwave energy, RF energy, etc.) having a wavelength that is about 2.3 times the length of the one or more conductive traces.

According to an embodiment of the present invention, an article of manufacture, such as a PCB or other electronic component, includes a substrate having a surface of dielectric material (e.g., a polymeric dielectric material). A plurality of electrically isolated, elongated conductive traces are disposed on or adjacent to a target area of the substrate surface in substantially parallel, spaced-apart relationship along a direction. End portions of adjacent conductive traces are offset relative to each other along the direction. The conductive traces are configured to uniformly heat the substrate target area to a selected temperature when the substrate is irradiated with electromagnetic radiation, such as microwave energy and/or RF energy. Accordingly, when a component (e.g., another polymeric component) is placed in contacting relationship with the substrate at the target area and electromagnetic radiation is applied, the conductive traces heat the target area to a temperature sufficient to cause the component and substrate to fuse together. This embodiment of the present invention is particularly advantageous when used to attach a physical enclosure around a microelectronic component because a hermetic seal can be achieved without the use of adhesives and without ultrasonic welding.

According to an embodiment of the present invention, an article of manufacture (e.g., a printed circuit board, etc.) includes a substrate having a dielectric surface and one or more electrically isolated conductive traces disposed on a target area of the substrate surface. The one or more conductive traces each have a base with spaced-apart, adjacent U-shaped legs extending from the base. Each U-shaped leg includes a first elongated portion that contacts the base and a spaced-apart second elongated portion having a free end. The free ends of the second elongated portions may be adjacent to each other in some embodiments of the present invention. The one or more conductive traces are configured to uniformly heat the substrate target area to a selected temperature when irradiated with electromagnetic radiation (e.g., microwave energy, RF energy, etc.) having a wavelength that is about 2.3 times the length of the one or more conductive traces. In some embodiments, the one or more conductive traces are in spaced-apart relationship along a pattern.

According to another embodiment of the present invention, an article of manufacture includes a substrate having a dielectric surface with an electrically isolated conductive pattern disposed on or adjacent to a target area of the substrate surface. The conductive pattern includes a first set of electrically isolated conductive traces in substantially parallel, spaced-apart relationship along a first direction. End portions of adjacent ones of the conductive traces in the first set are offset relative to each other along the first direction. The conductive pattern also includes a second set of electrically isolated conductive traces. The conductive traces in the second set have U-shaped configurations and are arranged in opposing, interdigitated relationship. The conductive traces in the second set are oriented at an angle substantially transverse to the first direction.

The first and second sets of conductive traces are configured to uniformly heat the substrate target area to a selected temperature when the substrate is irradiated with electromagnetic radiation, such as microwave energy, RF energy, or a combination of microwave and RF energy. Accordingly, when a polymeric component is placed in contacting relationship with the substrate at target area and electromagnetic radiation is applied, the conductive pattern heats the target area to a selected temperature sufficient to cause the component and substrate to fuse together.

According to another embodiment of the present invention, an article of manufacture includes a substrate having a dielectric surface with a plurality of electrically isolated conductive patterns disposed on or adjacent to a respective plurality of target areas of the substrate surface. Each conductive pattern includes a pair of opposite column portions that extend along a first direction and a pair of opposite row portions extending between the column portions and along a second direction transverse to the first direction.

Each column portion includes a set of first electrically isolated, conductive traces in substantially parallel, spaced-apart relationship along the first direction. End portions of adjacent ones of the first conductive traces in the set are offset relative to each other along the first direction. Each row portion includes a pair of second electrically isolated, conductive traces. Each second conductive trace has a U-shaped configuration, and each pair of second conductive traces are arranged in opposing, interdigitated relationship.

The column portions and row portions uniformly heat a respective substrate target area to a selected temperature when the substrate is irradiated with electromagnetic radiation, such as microwave energy, RF energy, or a combination of microwave and RF energy. Accordingly, when polymeric components are placed in contacting relationship with the substrate at respective target areas and electromagnetic radiation is applied, conductive patterns heat the respective target areas to a selected temperature sufficient to cause the components to fuse to the substrate.

In other embodiments of the present invention, a method of bonding components includes positioning a first component in contacting relationship with a target area of a second component, wherein one or more conductive patterns are disposed at the target area, and irradiating the conductive pattern with electromagnetic radiation. Each conductive pattern comprises a set of electrically isolated conductive traces in spaced-apart relationship, wherein each conductive trace is configured to uniformly heat the substrate target area to a selected temperature sufficient for the first and second components to fuse together when irradiated with electromagnetic radiation having a wavelength that is about 2.3 times the length of the conductive trace. Irradiating the conductive patterns with electromagnetic radiation causes the target area to heat to a temperature such that the first and second components fuse together at the target area.

According to another embodiment of the present invention, a method of bonding components includes positioning a first component in contacting relationship with a target area of a second component. A conductive pattern is disposed at the target area of the second component that is configured to uniformly heat the target area to a selected temperature sufficient to fuse the first and second components together when irradiated with electromagnetic radiation. The conductive pattern is irradiated with electromagnetic radiation such that the target area heats to the selected temperature causing the first and second components to fuse together at the target area. Irradiating the conductive pattern with electromagnetic radiation may include microwave or radio frequency (RF) energy, or a combination of microwave and RF energy. The conductive pattern may be configured, via dimensional changes and/or configuration, such that selected conductive traces heat to a selected temperature when irradiated with a first frequency of microwave energy, and wherein selected other ones of the conductive traces heat to a selected temperature when irradiated with a second frequency of microwave energy. Similarly, the conductive pattern may be configured, via dimensional changes and/or configuration, such that selected conductive traces heat to a selected temperature when irradiated with a first frequency of RF energy, and wherein selected other ones of the conductive traces heat to a selected temperature when irradiated with a second frequency of RF energy. The frequency or frequencies of microwave and/or RF energy are selected such that the components are not damaged, so that coupling efficiency is maximized, and so that the conductive traces do not excessively heat locally or arc. This embodiment of the present invention is particularly advantageous when used to attach a physical enclosure around a microelectronic component because a seal can be achieved without the use of adhesives and without requiring conventional techniques, such as ultrasonic welding. In some embodiments of the present invention, an hermetic seal can be obtained.

According to another embodiment of the present invention, a method of bonding components includes applying a curable resin having adhesive properties to a target area of a first component. A conductive pattern is disposed at the target area that is configured to uniformly heat the target area to a temperature sufficient to cure the resin when irradiated with electromagnetic radiation. A second component is positioned in contacting relation with the adhesive resin and the conductive pattern is irradiated with electromagnetic radiation such that the target area heats and cures the adhesive resin and so that the first and second components are secured together at the target area. The conductive pattern may have various shapes and configurations. Irradiating the conductive pattern with electromagnetic radiation may include microwave or radio frequency (RF) energy, or a combination of microwave and RF energy.

According to another embodiment of the present invention, a method of bonding components includes positioning a first component in contacting relationship with a first target area of a second component. A first conductive pattern is disposed at the first target area. The first conductive pattern is configured to uniformly heat the first target area to a first temperature sufficient to bond the first and second components together when irradiated with electromagnetic radiation at a first frequency. A third component is positioned in contacting relationship with a second target area of the second component. A second conductive pattern is disposed at the second target area that is configured to uniformly heat the second target area to a second temperature sufficient to bond the third and second components together when irradiated with electromagnetic radiation at a second frequency that is different from the first frequency. The first conductive pattern is irradiated with electromagnetic radiation at the first frequency such that the first target area heats to the first temperature, thereby causing the first and second components to fuse together at the first target area. The second conductive pattern is irradiated with electromagnetic radiation at the second frequency such that the second target area heats to the second temperature and the third and second components fuse together at the second target area. The first and second conductive patterns may have various shapes and configurations. Irradiating the conductive patterns with electromagnetic radiation may include microwave or radio frequency (RF) energy, or a combination of microwave and RF energy.

According to another embodiment of the present invention, a method of bonding components includes positioning a first curable material in contacting relationship with a first target area of a component. A first conductive pattern is disposed at the first target area that is configured to uniformly heat the first target area to a first temperature sufficient to cure the first material when irradiated with electromagnetic radiation at a first frequency. A second curable material is positioned in contacting relationship with a second target area of the component. A second conductive pattern is disposed at the second target area that is configured to uniformly heat the second target area to a second temperature sufficient to cure the second material when irradiated with electromagnetic radiation at a second frequency different from the first frequency. The first conductive pattern is irradiated with electromagnetic radiation at the first frequency such that the first target area heats to the first temperature and cures the first material. The second conductive pattern is irradiated with electromagnetic radiation at the second frequency such that the second target area heats to the second temperature and cures the second material. The first and second conductive patterns may have various shapes and configurations. Irradiating the conductive patterns with electromagnetic radiation may include microwave or radio frequency (RF) energy, or a combination of microwave and RF energy.

According to another embodiment of the present invention, a method of bonding components includes positioning a bonding insert at an interface between a first component surface and an abutting second component surface. The bonding insert includes a substrate having adhesive resin and a conductive pattern in contacting relationship with the adhesive resin. The adhesive resin is selected so that when the conductive pattern generates heat upon being irradiated, the resin adhesively bonds with the material of the first and second components.

The conductive pattern in a bonding insert may have various shapes and configurations. The bonding insert is irradiated with electromagnetic radiation such that the conductive pattern uniformly heats the substrate to a temperature sufficient to cure the adhesive resin and bond the first and second components together at the interface. Irradiating the bonding insert with electromagnetic radiation may include microwave or radio frequency (RF) energy, or a combination of microwave and RF energy.

According to another embodiment of the present invention, a method of bonding components includes positioning a bonding insert at an interface between a first component surface and an abutting second component surface. The bonding insert includes a substrate having a conductive pattern that is configured to uniformly heat the substrate to a temperature sufficient to fuse the first and second components together at the interface when irradiated with electromagnetic radiation. The conductive pattern may have various shapes and configurations. The bonding insert is irradiated with electromagnetic radiation thereby causing the conductive pattern to uniformly heat the substrate to a temperature sufficient to fuse the first and second components together at the interface. Irradiating the bonding insert with electromagnetic radiation may include microwave or radio frequency (RF) energy, or a combination of microwave and RF energy.

Embodiments of the present invention can be advantageous over conventional methods of bonding components because selective bonding can be achieved and damage caused by localized heating and arcing can be eliminated. Embodiments of the present invention are especially advantageous when used in conjunction with the assembling of electronics components having complex shapes and configurations. Moreover, conductive patterns, according to embodiments of the present invention, can be part of the dam used in liquid encapsulation techniques for electronics packaging. Conductive patterns can also be made as part of the material to be bonded via insertion molding and other similar techniques.

Embodiments of the present invention can be advantageous in a variety of applications and industries including the bonding of polymeric automotive parts, the bonding of polymer components in the shoe industry, and the joining and fusing of polymeric piping. Because conductive patterns can be configured to mimic the area to be bonded, the present invention is especially advantageous when used to join the polymeric packaging or outer casings of devices used in the electronics, imaging, and aerospace fields. In addition, the conductive pattern, according to the present invention, can be utilized in gasket materials, in thread sealing materials, in thread locking materials, and in porosity sealing materials.

According to other embodiments of the present invention, flat substrates can be sealed at their perimeters, for example, in MEMS applications where a glass plate is sealed at the perimeter with another glass substrate or with a silicon wafer. Other applications include liquid crystal displays (LCD's) where the substrates are sealed at the perimeter to prevent unwanted heat in the middle surfaces.

BRIEF DESCRIPTION OF THE DRAWINGS

The accompanying drawings, which form a part of the specification, illustrate embodiments of the present invention. The drawings and description together serve to fully explain the invention.

DETAILED DESCRIPTION

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification are taken to specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the drawings, the thickness of lines, layers and regions may be exaggerated for clarity. It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the Figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

As used herein, the term "conductive trace" refers to a segment of electrically conductive material having any of various configurations. Although conductive traces may be similar in shape, size and configuration of some electronic circuitry, conductive traces, as used herein, are not associated with electronic circuitry of any type. That is, conductive traces, according to embodiments of the present invention, only serve the function of heating when exposed to electromagnetic radiation. Conductive traces according to embodiments of the present invention do not serve any electronic circuitry function.

Applicants have unexpectedly discovered a relationship between the length of a conductive trace, according to embodiments of the present invention, and the incident wavelength of electromagnetic radiation (e.g., microwave energy, RF energy, etc.) necessary to cause the conductive trace to heat up to a selected temperature. This relationship is represented by the following equation $RL=0.43\lambda$; wherein RL is "resonance length" of a conductive trace and "$\lambda$" is the incident wavelength of microwave energy. Stated another way, a conductive trace, according to embodiments of the present invention, will resonate and heat up when irradiated with electromagnetic radiation (e.g., microwave energy, RF energy, etc.) having a wavelength that is about 2.3 times the length of the conductive trace. As such, resonance of a conductive trace can be triggered when exposed, for example, to microwave energy based upon the length of the conductive trace. Based upon empirical data, Applicants have determined that this relationship may vary by plus or minus 6%. Accordingly, the term "about 2.3 times the length of the conductive trace", as used herein, is intended to include the range of 2.2-2.4 times the length of the conductive trace.

The length of a conductive trace, according to embodiments of the present invention, is independent of a pattern or shape into which the conductive trace is configured. In other words, a conductive trace that resonates at a certain wavelength of electromagnetic energy will do so in a linear configuration and in a configured pattern.

As used herein, the term "dielectric material" refers to a substance that is a poor conductor of electricity. Exemplary dielectric materials that may be used according to embodiments of the present invention include, but are not limited to, porcelain (ceramic), mica, glass, plastics, and the oxides of various metals.

Figure 1:
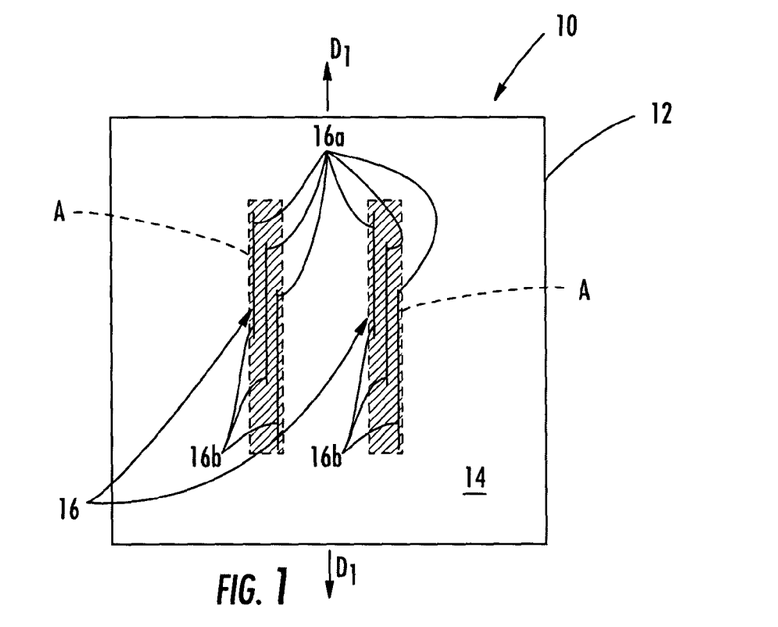
FIG. 1 illustrates a substrate having a plurality of conductive traces disposed thereon, according to embodiments of the present invention.

Referring initially to FIG. 1, an article 10 having a plurality of conductive traces disposed thereon, according to embodiments of the present invention, is illustrated. The illustrated article 10, may be virtually any kind of component or device to which it is desired to attach another component. For example, article 10 may be a PCB to which an microelectronic component is to be attached and to which a physical structure is to be secured that encloses the microelectronic component.

The illustrated article 10 includes a substrate 12 having a dielectric surface 14. The dielectric surface 14 may be a dielectric material coating on the substrate 12 and/or the substrate 12 may be formed from dielectric material. A plurality of electrically isolated, elongated conductive traces 16 are disposed on respective target areas A of the substrate surface 14 in substantially parallel, spaced-apart relationship along a direction $D_1$. The term "electrically isolated", as used herein, means that the conductive traces are not in electrical communication with any electrical circuitry or components.

Each target area A includes polymeric material to which a component is to be attached. The substrate surface 14 may be formed from the same polymeric material as target areas A or may be a different polymeric (or other) material.

End portions 16a, 16b of adjacent conductive traces 16 are offset relative to each other along direction $D_1$ as illustrated. The term "offset" as used herein includes any configuration wherein the end portions 16a, 16b of adjacent conductive traces 16 do not terminate at the same location along a direction (e.g., along $D_1$). For example, the term "offset" includes, but is not limited to, a "stair-step" configuration as illustrated in FIG. 1, and an alternating "up-down" configuration. Moreover, combinations of various alternating and stair-step configurations may be utilized.

The conductive traces 16 are configured to uniformly heat each respective target area A to a selected temperature when the substrate is irradiated with electromagnetic radiation, such as microwave energy and/or RF energy, as will be described below. As such, another polymeric material component can be placed in contacting relationship with the substrate 12 at target area A, and electromagnetic radiation applied to heat target area A sufficiently to cause the component to fuse to the substrate 12. The terms "fuse", "fused", and "fuses", as used herein, mean that materials of components to be joined together, upon the generation of heat, liquefies along the interface, mixes together, and solidifies to form a bond. As such, no adhesive is required to bond components together.

Alternatively, a curable adhesive resin could be placed at target area A, and a component to be attached to the substrate could be placed in contacting relationship with the adhesive resin. Upon the application of electromagnetic radiation, target area A heats up to cure the adhesive resin so as to firmly secure the component to the substrate 12.

In all embodiments of the present invention, each conductive trace has a length less than or equal to about twenty two millimeters (22 mm), a width less than or equal to about one millimeter (1 mm), and a thickness of less than or equal to about eighteen microns (18 p). In all embodiments of the present invention, one or more portions of one or more of the conductive traces may be embedded within the substrate surface at the target area.

Suitable materials out of which conductive traces may be formed for all embodiments of the present invention include any type of electrically conductive material, including, but not limited to, metals, such as copper, aluminum, silver, and the like; conductive inks; and conductive non-metals, such as graphite, polymers, and the like. The configuration of the conductive traces typically defines the pattern of the desired bond between components. The material of each conductive trace 16 couples with the applied electromagnetic radiation to create a flow of electrical current therethrough, which produces heat. The heat generated by each conductive trace 16 is a function of, among others, the conductive trace material and configuration, and the degree of impermeability of the components to be joined to microwave energy. Consequently, the amount of heat necessary to fuse two polymeric components (or cure an adhesive resin) is controllable by the electromagnetic radiation applied including the power and frequency or frequencies applied.

According to embodiments of the present invention, electromagnetic radiation utilized may include microwave or radio frequency (RF) energy, or a combination of microwave and RF energy. The conductive traces 16 may be configured, via dimensional changes and/or arrangement, such that selected conductive traces 16 heat to a selected temperature when irradiated with a first frequency of microwave energy, and wherein selected other ones of the conductive traces 16 heat to a selected temperature (i.e., the same or different temperature) when irradiated with a second frequency of microwave energy. Similarly, the conductive traces 16 may be configured, via dimensional changes and/or arrangement, such that selected conductive traces 16 heat to a selected temperature when irradiated with a first frequency of RF energy, and wherein selected other ones of the conductive traces 16 heat to a selected temperature when irradiated with a second frequency of RF energy. The frequency or frequencies of microwave and/or RF energy are selected such that components being bonded together are not damaged, so that coupling efficiency is maximized, and so that the conductive traces 16 do not arc.

Figure 2:
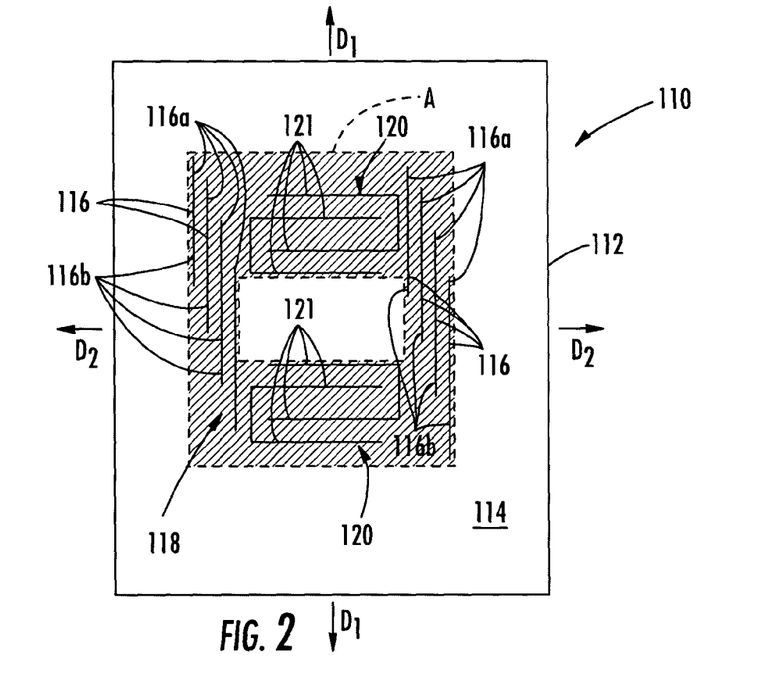
FIG. 2 illustrates a substrate having a conductive pattern disposed thereon, according to embodiments of the present invention.

Referring to FIG. 2, an article 110, according to another embodiment of the present invention, is illustrated. The illustrated article 110, may be virtually any kind of component or device to which it is desired to attach another component. For example, article 110 may be a PCB to which an microelectronic component is to be attached and to which a physical structure is to be secured that encloses the microelectronic component. The illustrated article 110 includes a substrate 112 having a dielectric surface 114. The dielectric surface 114 may be a coating of dielectric material on the substrate 112 and/or the substrate 112 may be formed from dielectric material. An electrically isolated conductive pattern 118 is disposed on a target area A of the substrate surface 114.

The illustrated conductive pattern 118 includes a first set of electrically isolated conductive traces 116 in substantially parallel, spaced-apart relationship along a first direction $D_1$. End portions 116a, 116b of adjacent ones of the conductive traces 116 in the first set are offset relative to each other along the first direction $D_1$, as illustrated.

The illustrated conductive pattern 118 also includes a second set of electrically isolated conductive traces 120. The conductive traces 120 in the second set have U-shaped configurations and are arranged in opposing, interdigitated relationship, as illustrated. The conductive traces 120 in the second set are oriented at an angle substantially transverse to the first direction $D_1$ (i.e., the leg portions 121 extend along a second direction $D_2$). Moreover, each conductive trace 120 in the second set comprises a pair of elongated, substantially parallel leg portions 121. In the illustrated embodiment, the number of leg portions 121 of the conductive traces 120 in the second set is equal to the number of conductive traces 116 in the first set. In the illustrated embodiment, there are eight total leg portions 121 and eight (8) total conductive traces 116 in the first set. However, it is understood that the number of legs 121 and conductive traces 116 in the first set may be different. Embodiments of the present invention are not limited to the illustrated numbers of leg portions 121 of the second conductive traces 120 and the first conductive traces 116.

The first and second sets of conductive traces 116, 120 are configured to uniformly heat the substrate surface target A area to a selected temperature when the substrate is irradiated with electromagnetic radiation, such as microwave energy, RF energy, or a combination of microwave and RF energy. As such, another polymeric material component can be placed in contacting relationship with the substrate 112 at target area A, and electromagnetic radiation applied to heat target area A sufficiently to cause the component to be fused to the substrate 112. Alternatively, a curable adhesive resin could be placed at target area A, and a component to be attached to the substrate could be placed in contacting relationship with the adhesive resin. Upon the application of electromagnetic radiation, target area A can heat up to cure the adhesive resin so as to firmly secure the component to the substrate 112.

According to embodiments of the present invention, each conductive trace 116, 120 has a length less than or equal to about twenty two millimeters (22 mm), a width less than or equal to about one millimeter (1 mm), and a thickness of less than or equal to about eighteen microns (18μ). According to embodiments of the present invention, one or more portions of one or more of the conductive traces 116, 120 may be embedded within the substrate surface 114 at the target area A.

According to embodiments of the present invention, electromagnetic radiation utilized may include microwave or radio frequency (RF) energy, or a combination of microwave and RF energy. The conductive traces 116, 120 may be configured, via dimensional changes and/or arrangement, such that selected conductive traces 116, 120 heat to a selected temperature when irradiated with a first frequency of microwave energy, and wherein selected other ones of the conductive traces 116, 120 heat to a selected temperature when irradiated with a second frequency of microwave energy. Similarly, the conductive traces 116, 120 may be configured, via dimensional changes and/or arrangement, such that selected conductive traces 116, 120 heat to a selected temperature when irradiated with a first frequency of RF energy, and wherein selected other ones of the conductive traces 116, 120 heat to a selected temperature when irradiated with a second frequency of RF energy. The frequency or frequencies of microwave and/or RF energy are selected such that the components are not damaged, so that coupling efficiency is maximized, and so that the conductive traces 116, 120 do not arc.

Figures 3, 3A:
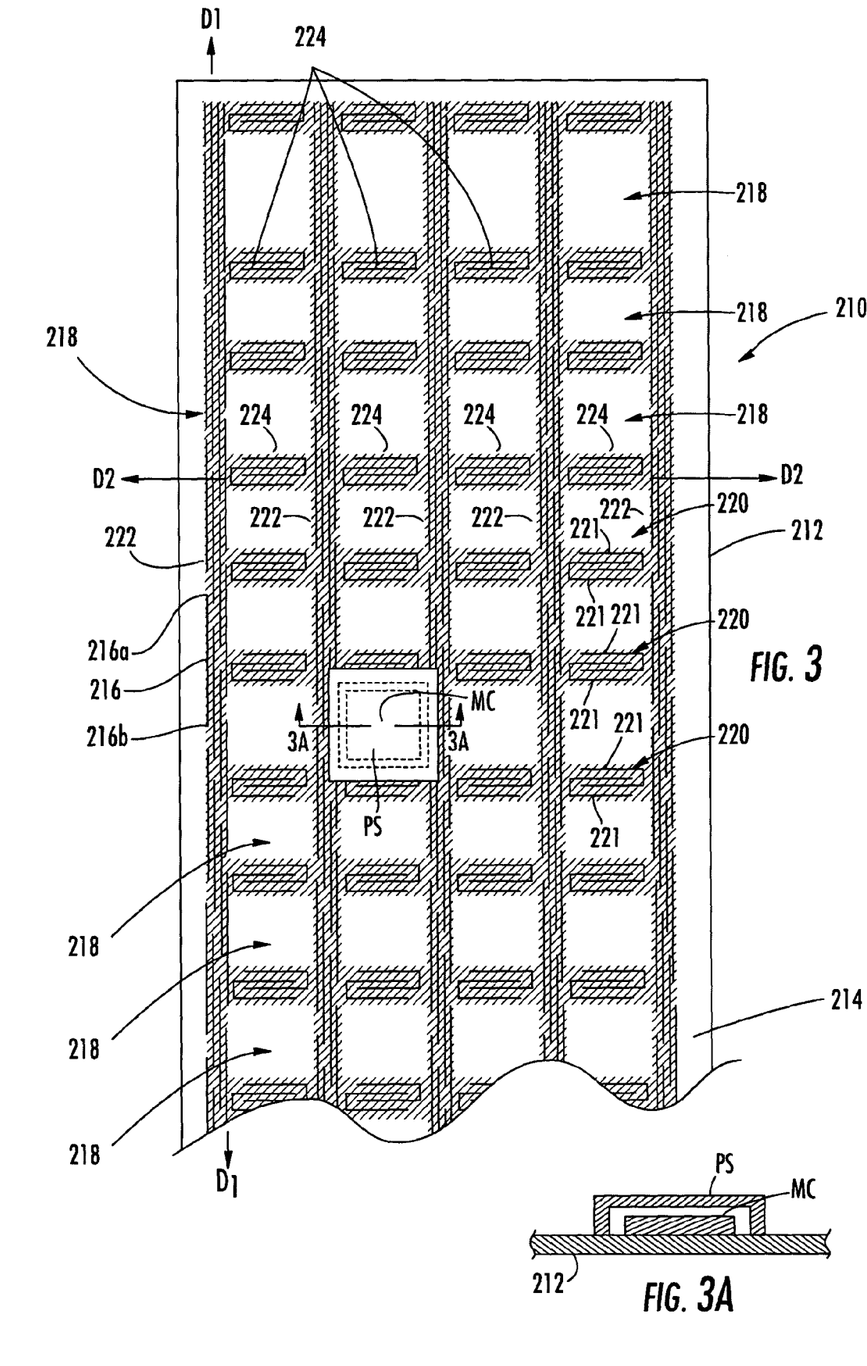
FIG. 3 illustrates a substrate having a plurality of conductive patterns disposed thereon, according to embodiments of the present invention.
FIG. 3A is a cross sectional view of the substrate of FIG. 3 taken along lines 3A-3A and illustrating a microelectronic component attached to the substrate with a physical structure enclosing and hermetically sealing the microelectronic component.

Referring to FIG. 3, an article 210, according to another embodiment of the present invention, is illustrated. The illustrated article 210, is a PCB to which a plurality of microelectronic components MC are to be attached and over which a respective plurality of physical structures PS are to be secured that enclose the microelectronic components. FIG. 3A is a cross sectional view of a microelectronic component MC attached to article substrate 212 with a physical structure PS enclosing and hermetically sealing the microelectronic component.

The illustrated article 210 includes a substrate 212 having a dielectric surface 214. The dielectric surface 214 may be a coating on the substrate 212 and/or the substrate 212 may be formed from dielectric material. A plurality of electrically isolated, conductive patterns 218 are disposed on a respective plurality of target areas A of the substrate surface 214. Each conductive pattern 218 includes a pair of opposite column portions 222 that extend along a first direction $D_1$ and a pair of opposite row portions 224 extending between the column portions and along a second direction $D_2$ transverse to the first direction.

Each column portion 222 includes a set of first electrically isolated, conductive traces 216 in substantially parallel, spaced-apart relationship along the first direction $D_1$. End portions 216a, 216b of adjacent ones of the first conductive traces 216 in the set are offset relative to each other along the first direction $D_1$, as illustrated. Each row portion 224 includes a pair of second electrically isolated, conductive traces 220. Each second conductive trace 220 has a U-shaped configuration, and each pair of second conductive traces 220 are arranged in opposing, interdigitated relationship, as illustrated.

The column portions 222 and row portions 224 uniformly heat a respective substrate target area A to a selected temperature when the substrate is irradiated with electromagnetic radiation, such as microwave energy, RF energy, or a combination of microwave and RF energy. As such, another polymeric material component can be placed in contacting relationship with the substrate 212 at a target area A, and electromagnetic radiation applied to heat target area A sufficiently to cause the component to be fused to the substrate 212. Alternatively, a curable adhesive resin can be placed at target area A, and a component to be attached to the substrate could be placed in contacting relationship with the adhesive resin. Upon the application of electromagnetic radiation, target area A would heat up to cure the adhesive resin so as to firmly secure the component to the substrate 212.

According to embodiments of the present invention, electromagnetic radiation utilized may include microwave or radio frequency (RF) energy, or a combination of microwave and RF energy. The conductive traces 216, 220 may be configured, via dimensional changes and/or arrangement, such that selected conductive traces 216, 220 heat to a selected temperature when irradiated with a first frequency of microwave energy, and wherein selected other ones of the conductive traces 216, 220 heat to a selected temperature when irradiated with a second frequency of microwave energy. Similarly, the conductive traces 216, 220 may be configured, via dimensional changes and/or arrangement, such that selected conductive traces 216, 220 heat to a selected temperature when irradiated with a first frequency of RF energy, and wherein selected other ones of the conductive traces 216, 220 heat to a selected temperature when irradiated with a second frequency of RF energy. The frequency or frequencies of microwave and/or RF energy are selected such that the components are not damaged, so that coupling efficiency is maximized, and so that the conductive traces 216, 220 do not arc.

Figure 4A:
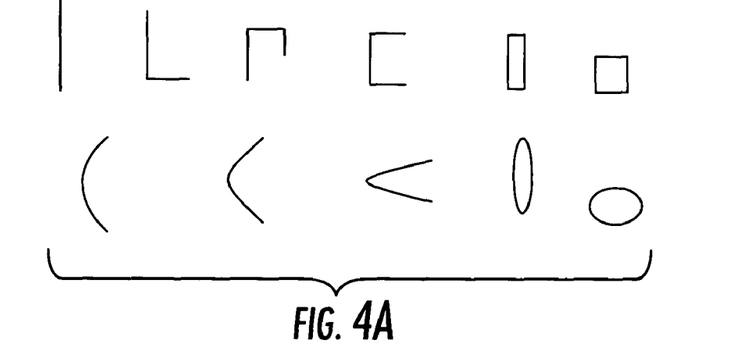
FIGS. 4A-4C illustrates various conductive trace configurations, according to embodiments of the present invention.

Conductive traces utilized in the various embodiments disclosed herein with respect to FIGS. 1-3 are not limited to the illustrated shapes. Conductive traces, according to embodiments of the present invention, can have various shapes. Exemplary other shapes, though not all inclusive, are illustrated in FIGS. 4A-4C.

Figure 4B:
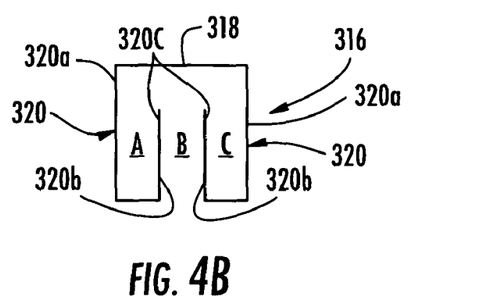

Referring to FIG. 4B, a conductive trace 316 that is configured to uniformly heat a substrate target area to a selected temperature when irradiated with electromagnetic radiation is illustrated. The illustrated conductive trace 316 is referred to as "pi-shaped" and has a base 318 with spaced-apart, adjacent U-shaped legs 320 extending from the base. Each U-shaped leg 320 includes a first elongated portion 320a that contacts the base 318 and a spaced-apart second elongated portion 320b having a free end 320c, as illustrated. In the illustrated configuration, the free ends 320c of the second elongated portions 320b are adjacent to each other. The illustrated conductive trace 316 defines three sections A, B, C that have substantially equal widths. However, embodiments of the conductive trace 316 are not limited to configurations with substantially equal widths of the three sections.

Figure 4C:
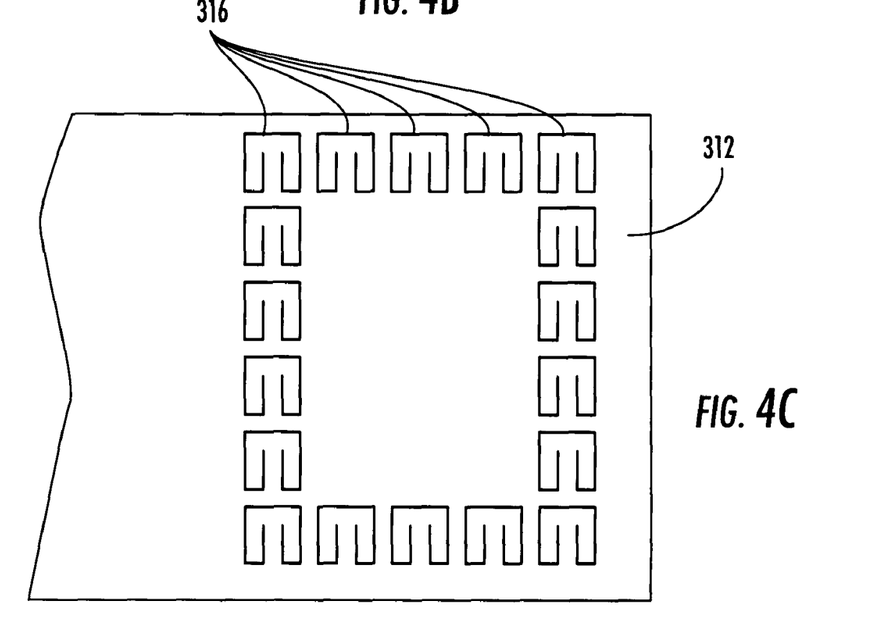

The illustrated conductive trace 316 is very efficient in heating and leads to uniform heating even when a series of these conductive traces 316 are arranged in a pattern on a substrate, for example as illustrated on the substrate 312 in FIG. 4C. Moreover, the conductive trace 316 is, as are all of the conductive traces described herein, configured to uniformly heat to a selected temperature when irradiated with electromagnetic radiation having a wavelength that is about 2.3 times the length of the conductive trace 316.

Figure 5:
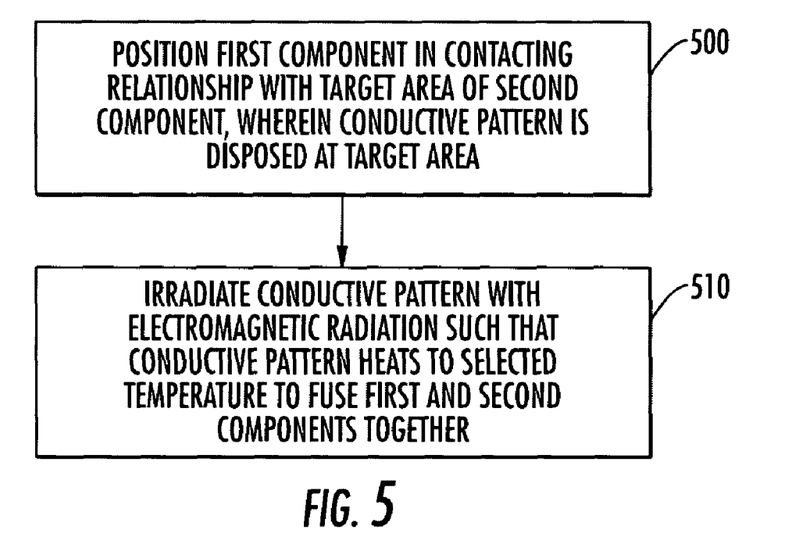
FIGS. 5-10 are flow charts illustrating operations for bonding components according embodiments of the present invention.

Referring to FIG. 5, a method of bonding components, according to embodiments of the present invention, includes positioning a first component in contacting relationship with a target area of a second component, wherein a conductive pattern is disposed at the target area of the second component and that is configured to uniformly heat the target area to a selected temperature sufficient to fuse the first and second components together when irradiated with electromagnetic radiation (Block 500), and irradiating the conductive pattern with electromagnetic radiation such that the target area heats to the temperature and the first and second components fuse together at the target area (Block 510). The conductive pattern may have various shapes and configurations as described above with respect to FIGS. 1-4.

Irradiating the conductive pattern with electromagnetic radiation may include microwave or radio frequency (RF) energy, or a combination of microwave and RF energy. The conductive pattern may be configured, via dimensional changes and/or arrangement, such that selected conductive traces heat to a selected temperature when irradiated with a first frequency of microwave energy, and wherein selected other ones of the conductive traces heat to a selected temperature (i.e., the same or different temperature) when irradiated with a second frequency of microwave energy. Similarly, the conductive pattern may be configured, via dimensional changes and/or arrangement, such that selected conductive traces heat to a selected temperature when irradiated with a first frequency of RF energy, and wherein selected other ones of the conductive traces heat to a selected temperature (i.e., the same or different temperature) when irradiated with a second frequency of RF energy. The frequency or frequencies of microwave and/or RF energy are selected such that the components are not damaged, so that coupling efficiency is maximized, and so that the conductive traces do not arc.

The material of a conductive pattern couples with the applied electromagnetic energy to create a flow of electrical current therethrough, which produces heat. The heat generated by the conductive pattern is a function of, among others, the conductive pattern material and configuration, and the degree of impermeability of the components to be joined to electromagnetic energy. Consequently, the amount of heat necessary to fuse components or cure an adhesive resin is controllable by the electromagnetic energy applied, the power, and adjustment of the frequency or frequencies applied.

According to embodiments of the present invention, variable frequency microwave energy is applied to the conductive pattern. Variable frequency microwaves can rapidly and uniformly heat the target area without adversely affecting the components being bonded together. However, single frequency microwave energy may also be used.

A particularly preferred variable frequency microwave furnace is described in U.S. Pat. No. 5,321,222, to Bible et al., the disclosure of which is incorporated herein by reference in its entirety. A variable frequency microwave furnace typically includes a microwave signal generator or microwave voltage-controlled oscillator for generating a low-power microwave signal for input to the microwave furnace. A first amplifier may be provided to amplify the magnitude of the signal output from the microwave signal generator or the microwave voltage-controlled oscillator. A second amplifier is provided for processing the signal output by the first amplifier. A power supply is provided for operation of the second amplifier. A directional coupler is provided for detecting the direction of a signal and further directing the signal depending on the detected direction. Preferably a high-power broadband amplifier, such as, but not limited to, a traveling wave tube (TWT), tunable magnetron, tunable klystron, tunable twystron, and a tunable gyrotron, is used to sweep a range of frequencies of up to an octave in bandwidth spanning the 300 MHz to 300 GHz frequency range.

Appropriate use of variable frequency microwave processing, as disclosed herein, enhances uniform processing from one group of components to be bonded to the next because placement of the components within a microwave furnace is not critical. By contrast, with single frequency microwave processing, each group of components to be bonded must be oriented precisely the same way to achieve identical processing time and quality. Another advantage of using variable frequency microwave processing is a reduction of the effects of thermal stresses. By selecting frequencies that cause a conductive pattern to heat a target area to a selected temperature without causing excessive heating of the components, damage from thermal stresses may be avoided. Furthermore, because the present invention allows a target area to reach a selected temperature quickly, adjacent materials having different coefficients of thermal expansion, do not have enough time to expand or contract and, thereby, cause excessive thermal stresses at their interface.

The practical range of frequencies within the electromagnetic spectrum from which microwave frequencies may be chosen is about 0.90 GHz to 40 GHz. Every group of components irradiated with microwave energy typically has at least one bandwidth, or window of frequencies within this overall range that will fuse components together or cure adhesive resin without causing damage to the components being bonded together. The term "window", as used herein, refers to a range of microwave frequencies bounded on one end by a specific frequency and bounded on the opposite end by a different specific frequency. Above or below a particular window of damage-free frequencies, damage may occur to the components. A window may vary depending on the component configuration, geometry, and material composition. A window may also vary depending on the nature and configuration of sub-components within a component. Sub-components may have different windows of damage-free frequencies, as well. A component may have a sub-component therein requiring a narrow window of frequencies, and a sub-component therein requiring a wide window of frequencies. The selection of a damage-free window for a particular component or group of components is typically obtained either empirically through trial and error, or theoretically using power reflection curves and the like.

Within a window of damage-free frequencies for a particular group of components, it is generally desirable to select the frequencies that result in the shortest time for a target area to reach a selected temperature. Preferably, a component group is processed with a subset of frequencies from the upper end of each window. More modes can be excited with higher frequencies than with lower frequencies which means better uniformity in heating is typically achieved. Additionally, more microwave energy absorption and less microwave penetration depth, results in shorter heating times. However, any subset of frequencies within a window of damage-free frequencies may be used.

Many components that are irradiated with microwave energy have multiple windows of frequencies within which a target area can be heated via a conductive pattern without causing damage. For example, a component may be irradiated with microwave energy without damage between 3.50 GHz and 6.0 GHz, and may also be irradiated without damage between 7.0 GHz and 10.0 GHz. The availability of additional windows provides additional flexibility for achieving rapid, yet damage-free target area heating. Often times complex geometrical configurations and material combinations are encountered which may actually shrink or close a particular window of frequencies available for processing. The availability of alternative windows permits a group of components to be bonded with microwave irradiation without having to resort to other bonding methods.

Preferably, the step of irradiating a conductive pattern is performed by "sweeping" the conductive pattern with variable frequencies from within a particular window of damage-free frequencies. The term "sweeping", as used herein, refers to irradiating the conductive pattern to many of the frequencies within a particular window. Frequency sweeping results in uniformity of heating because many more complementary cavity modes can be excited. Sweeping may be accomplished by launching the different frequencies within a window either simultaneously, or sequentially. For example, assume the window of damage-free frequencies for a particular group of components is 2.60 GHz to 7.0 GHz. Frequency sweeping would involve continuously and/or selectively launching frequencies within this range in any desirable increments, (e.g., sweeping between 2.6 and 3.3 GHz) such as 2.6001 GHz, 2.6002 GHz, 2.6003 GHz . . . 3.30 GHz, etc. Virtually any incremental launching pattern may be used.

The rate at which the different frequencies are launched is referred to as the sweeping rate. This rate may be any value, including, but not limited to, milliseconds, seconds, and minutes. Preferably, the sweep rate is as rapid as practical for the particular workpiece being processed. The uniformity in processing afforded by frequency sweeping, provides flexibility in how groups of components to be bonded are oriented within a microwave furnace. Maintaining each group in precisely the same orientation is not required to achieve uniform processing.

Alternatively, the conductive pattern may be irradiated with RF energy in lieu of microwave energy. Any commercial or industrial generator capable of producing radio waves may be used to carry out the present invention. Generators may be added in parallel or in series to increase production or temperature. Generators may be harmonically suppressed or otherwise structured to meet standards for electromagnetic or radio frequency emissions. In a general embodiment, the components to be bonded are situated between two electrode plates which are charged alternately positive and negative. The plates are connected to the radio frequency generator.

Figure 6:
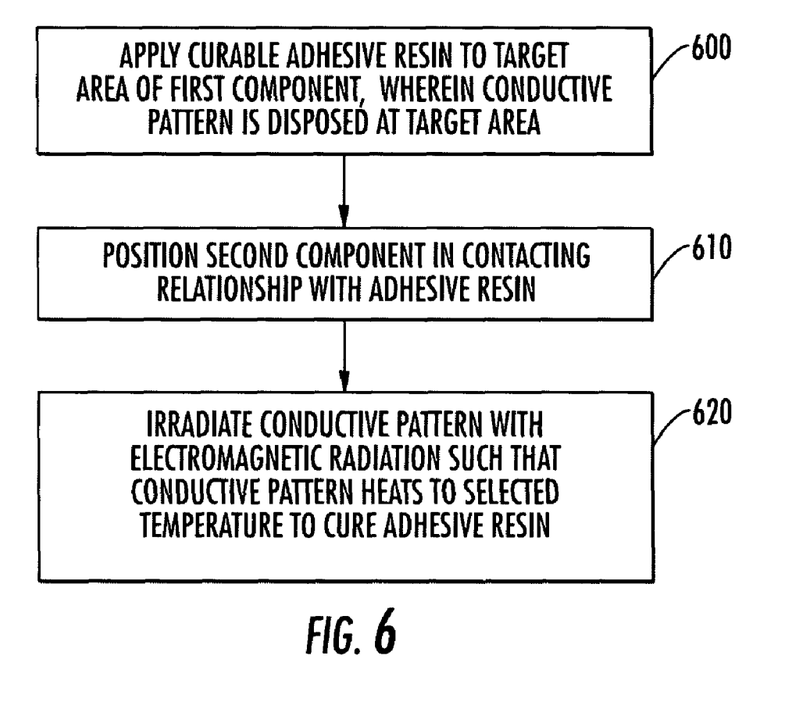

Referring to FIG. 6, a method of bonding components, according to embodiments of the present invention, includes applying a curable resin having adhesive properties to a target area of a first component, wherein a conductive pattern is disposed at the target area that is configured to uniformly heat the target area to a temperature sufficient to cure the resin when irradiated with electromagnetic radiation (Block 600). A second component is positioned in contacting relation with the resin (Block 610) and the conductive pattern is irradiated with electromagnetic radiation such that the target area heats and cures the resin and such that the first and second components are secured together at the target area (Block 620).

A particularly suitable class of adhesive resins are thermosetting resins. By the term, "thermosetting", it is meant that the resin irreversibly solidifies or "sets" when completely cured by activating the curing agents, such as by heating using microwave irradiation. The present invention is also suitable for use with thermoplastic adhesive resins. Suitable resins include unsaturated polyesters, phenolics, acrylics, silicones, polyurethanes, polyamides and the like, and mixtures and blends thereof. Adhesive resins can include various additives commonly employed with thermosetting and thermoplastic resins such as fillers, curing agents, colorants, pigments, thickening agents, and the like.

The conductive pattern may have various shapes and configurations as described above with respect to FIGS. 1-4. Irradiating the conductive pattern with electromagnetic radiation may include microwave or radio frequency (RF) energy, or a combination of microwave and RF energy as described above with respect to FIGS. 1-5.

Figure 7:
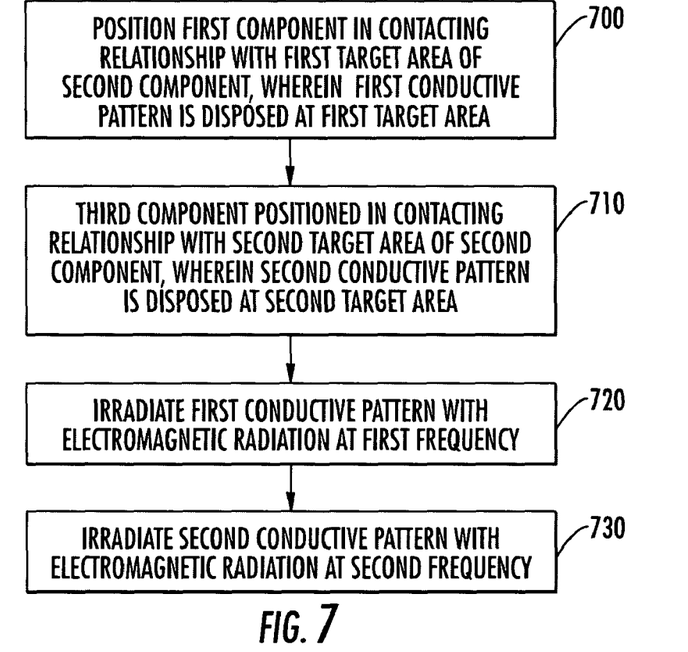

Referring to FIG. 7, a method of bonding components, according to embodiments of the present invention, includes positioning a first component in contacting relationship with a first target area of a second component, wherein a first conductive pattern is disposed at the first target area and wherein the first conductive pattern is configured to uniformly heat the first target area to a first temperature sufficient to bond the first and second components together when irradiated with electromagnetic radiation at a first frequency (Block 700). A third component is positioned in contacting relationship with a second target area of the second component, wherein a second conductive pattern is disposed at the second target area that is configured to uniformly heat the second target area to a second temperature sufficient to bond the third and second components together when irradiated with electromagnetic radiation at a second frequency different from the first frequency (Block 710). The first conductive pattern is irradiated with electromagnetic radiation at the first frequency such that the first target area heats to the first temperature and the first and second components fuse together at the first target area (Block 720). The second conductive pattern is irradiated with electromagnetic radiation at the second frequency such that the second target area heats to the second temperature and the third and second components fuse together at the second target area (Block 730).

The first and second conductive patterns may have various shapes and configurations as described above with respect to FIGS. 1-4. Irradiating the conductive patterns with electromagnetic radiation may include microwave or radio frequency (RF) energy, or a combination of microwave and RF energy as described above with respect to FIGS. 1-5.

Figure 8:
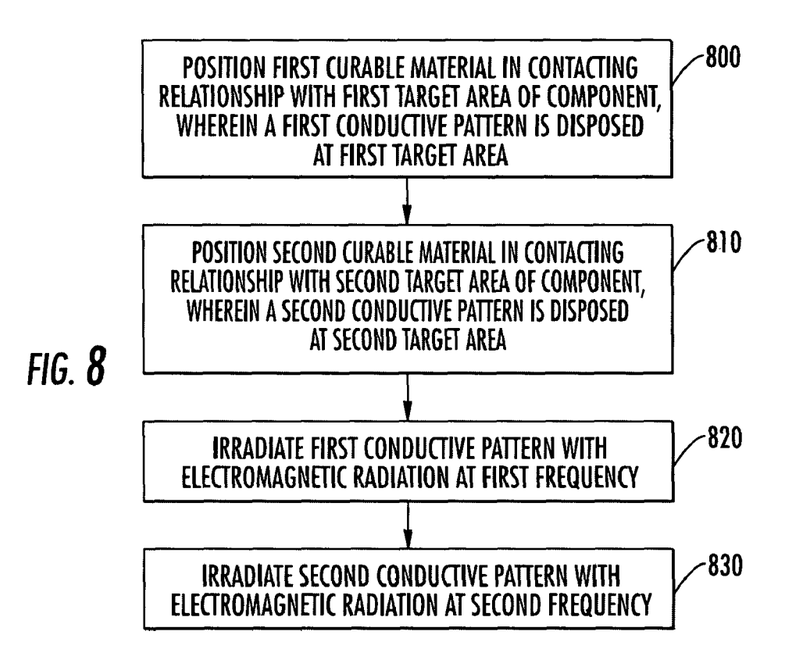

Referring to FIG. 8, a method of bonding components, according to embodiments of the present invention, includes positioning a first curable material in contacting relationship with a first target area of a component, wherein a first conductive pattern is disposed at the first target area that is configured to uniformly heat the first target area to a first temperature sufficient to cure the first material when irradiated with electromagnetic radiation at a first frequency (Block 800). A second curable material is positioned in contacting relationship with a second target area of the component, wherein a second conductive pattern is disposed at the second target area that is configured to uniformly heat the second target area to a second temperature sufficient to cure the second material when irradiated with electromagnetic radiation at a second frequency different from the first frequency (Block 810). The first conductive pattern is irradiated with electromagnetic radiation at the first frequency such that the first target area heats to the first temperature and cures the first material (Block 820). The second conductive pattern is irradiated with electromagnetic radiation at the second frequency such that the second target area heats to the second temperature and cures the second material (Block 830).

The first and second conductive patterns may have various shapes and configurations as described above with respect to FIGS. 1-4C. Irradiating the conductive patterns with electromagnetic radiation may include microwave or radio frequency (RF) energy, or a combination of microwave and RF energy as described above with respect to FIGS. 1-5.

Figure 9:
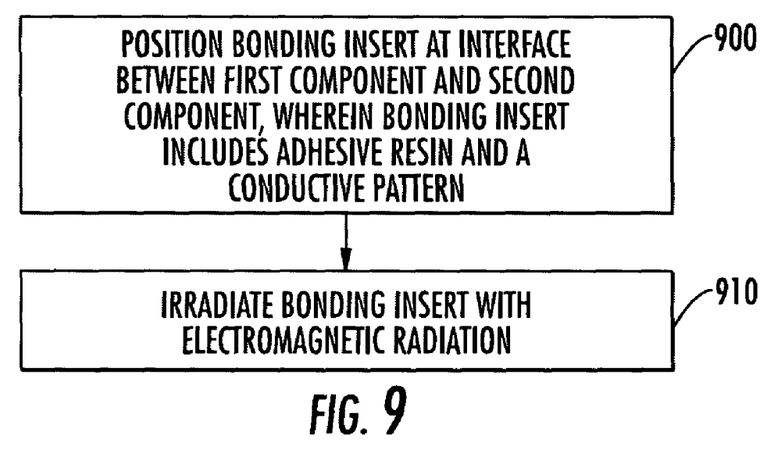

Referring to FIG. 9, a method of bonding components, according to embodiments of the present invention, includes positioning a bonding insert at an interface between a first component surface and an abutting second component surface (Block 900). The bonding insert includes a substrate having adhesive resin and a conductive pattern in contacting relationship with the adhesive resin. The adhesive resin is selected so that when the conductive pattern generates heat upon being irradiated, the resin adhesively bonds with the material of the first and second components.

The conductive pattern may have various shapes and configurations as described above with respect to FIGS. 1-4C. The conductive traces that make up the conductive pattern may have various configurations. The bonding insert is irradiated with electromagnetic radiation such that the conductive pattern uniformly heat the substrate to a temperature sufficient to cure the adhesive resin and bond the first and second components together at the interface (Block 910). Irradiating the bonding insert with electromagnetic radiation may include microwave or radio frequency (RF) energy, or a combination of microwave and RF energy as described above with respect to FIGS. 1-5.

Figure 10:
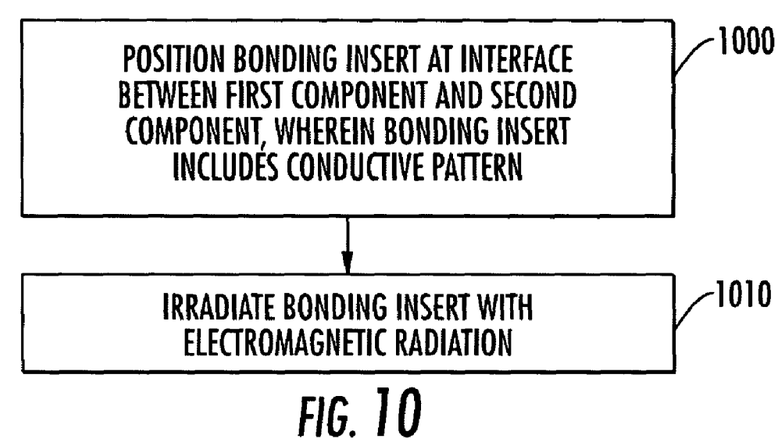

Referring to FIG. 10, a method of bonding components, according to embodiments of the present invention, includes positioning a bonding insert at an interface between a first component surface and an abutting second component surface (Block 1000). The bonding insert includes a substrate having a conductive pattern that is configured to uniformly heat the substrate to a temperature sufficient to fuse the first and second components together at the interface when irradiated with electromagnetic radiation. The conductive pattern may have various shapes and configurations as described above with respect to FIGS. 1-4C. The conductive traces that make up the conductive pattern may have various configurations. The bonding insert is irradiated with electromagnetic radiation such that the conductive pattern uniformly heat the substrate to a temperature sufficient to fuse the first and second components together at the interface (Block 1010). Irradiating the bonding insert with electromagnetic radiation may include microwave or radio frequency (RF) energy, or a combination of microwave and RF energy as described above with respect to FIGS. 1-5.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of bonding components, comprising:
    positioning a first component in contacting relationship with a target area of a second component, wherein a conductive pattern is disposed at the target area, wherein the conductive pattern comprises a set of electrically isolated conductive traces in spaced-apart relationship, wherein each conductive trace is configured to uniformly heat the substrate target area to a selected temperature sufficient for the first and second components to fuse together when irradiated with electromagnetic radiation, and wherein each conductive trace comprises a base with spaced-apart, adjacent U-shaped legs extending from the base, wherein each U-shaped leg comprises a first elongated portion that contacts the base and a spaced-apart second elongated portion having a free end; and
    irradiating the conductive pattern with electromagnetic radiation such that the target area heats to the temperature and the first and second components fuse together at the target area.

2. The method of claim 1, wherein the free ends of the second elongated portions are adjacent to each other.

3. The method of claim 1, wherein each conductive trace is configured to uniformly heat the substrate target area to a selected temperature when irradiated with electromagnetic radiation having a wavelength that is about 2.3 times the length of the conductive trace.

4. The method of claim 1, wherein the first and second components comprise polymeric material.

5. The method of claim 1, wherein the first component comprises a printed circuit board (PCB) and wherein the second component comprises an article to be secured to the PCB.

6. The method of claim 1, wherein irradiating the conductive pattern comprises exposing the conductive pattern to microwave energy.

7. The method of claim 1, wherein irradiating the conductive pattern comprises sweeping the conductive pattern with variable frequency microwaves selected from at least one window of microwave frequencies, the at least one window selected to avoid damage to the first and second components.

8. The method of claim 1, wherein irradiating the conductive pattern comprises sweeping the conductive pattern with RF energy.

9. The method of claim 1, wherein one or more portions of one or more of the conductive traces are embedded within the second component target area.

10. The method of claim 1, wherein selected ones of the conductive traces heat to a first temperature when irradiated with electromagnetic radiation at a first frequency, and wherein selected other ones of the conductive traces heat to a second temperature different from the first temperature when irradiated with electromagnetic radiation at a second frequency different from the first frequency.

11. A method of bonding components, comprising:
positioning a first component in contacting relationship with a target area of a second component, wherein a conductive pattern is disposed at the target area, wherein the conductive pattern comprises a set of electrically isolated conductive traces in spaced-apart relationship, wherein each conductive trace is configured to uniformly heat the substrate target area to a selected temperature sufficient for the first and second components to fuse together when irradiated with electromagnetic radiation, wherein selected ones of the conductive traces heat to a first temperature when irradiated with electromagnetic radiation at a first frequency, and wherein selected other ones of the conductive traces heat to a second temperature different from the first temperature when irradiated with electromagnetic radiation at a second frequency different from the first frequency, and wherein each conductive trace comprises a base with spaced-apart, adjacent U-shaped legs extending from the base; and irradiating the conductive pattern with electromagnetic radiation such that the target area heats to the temperature and the first and second components fuse together at the target area.

12. The method of claim 11, wherein the first and second components comprise polymeric material.

13. The method of claim 11, wherein the first component comprises a printed circuit board (PCB) and wherein the second component comprises an article to be secured to the PCB.

14. The method of claim 11, wherein irradiating the conductive pattern comprises exposing the conductive pattern to microwave energy.

15. The method of claim 11, wherein irradiating the conductive pattern comprises sweeping the conductive pattern with variable frequency microwaves selected from at least one window of microwave frequencies, the at least one window selected to avoid damage to the first and second components.

16. The method of claim 11, wherein irradiating the conductive pattern comprises sweeping the conductive pattern with RF energy.

17. The method of claim 11, wherein one or more portions of one or more of the conductive traces are embedded within the second component target area.

* * * * *

UNITED STATES PATENT AND TRADEMARK OFFICE
CERTIFICATE OF CORRECTION

| | | |
|---|---|---|
| PATENT NO. | : 7,901,536 B2 | Page 1 of 1 |
| APPLICATION NO. | : 11/807435 | |
| DATED | : March 8, 2011 | |
| INVENTOR(S) | : Fathi et al. | |

It is certified that error appears in the above-identified patent and that said Letters Patent is hereby corrected as shown below:

Column 10, Line 14: Please correct "(18p) to read -- (18µ) --

Signed and Sealed this
Nineteenth Day of July, 2011

David J. Kappos
*Director of the United States Patent and Trademark Office*